US005166573A

United States Patent [19]

Brown

[11] Patent Number: 5,166,573

[45] Date of Patent: Nov. 24, 1992

[54] ULTRASONIC CONTACT TRANSDUCER AND ARRAY

[75] Inventor: Lewis F. Brown, Reading, Pa.

[73] Assignee: Atochem North America, Inc., Philadelphia, Pa.

[21] Appl. No.: 583,132

[22] Filed: Sep. 17, 1990

Related U.S. Application Data

[63] Continuation-in-part of Ser. No. 411,918, Sep. 25, 1989, abandoned.

[51] Int. Cl.[5] ............................................ H01L 41/08

[52] U.S. Cl. .................................... 310/334; 310/330; 310/335; 310/800

[58] Field of Search ................................ 310/334-337, 310/330-332, 800

[56] References Cited

U.S. PATENT DOCUMENTS

| | | | |
|---|---|---|---|
| 3,969,927 | 7/1976 | Yoshida et al. | 310/800 X |
| 3,971,250 | 7/1976 | Taylor | 310/800 X |
| 4,370,182 | 1/1983 | Becker et al. | 310/800 X |
| 4,406,323 | 9/1983 | Edelman | 310/800 X |
| 4,443,730 | 4/1984 | Kitamura et al. | 310/800 X |
| 4,461,179 | 7/1984 | Holt | 310/800 X |
| 4,499,394 | 2/1985 | Koal | 310/800 X |
| 4,633,122 | 12/1986 | Radice | 310/339 |
| 4,701,659 | 10/1987 | Fujii et al. | 310/334 |
| 4,748,366 | 5/1988 | Taylor | 310/800 X |
| 4,833,659 | 5/1989 | Geil et al. | 310/332 X |

*Primary Examiner*—Mark O. Budd
*Attorney, Agent, or Firm*—Woodcock Washburn Kurtz Mackiewicz & Norris

[57] ABSTRACT

A flexible ultrasonic contact transducer comprises an unpoled polymeric film layer and a poled piezo film layer. Electrode shielding layers are disposed on outer surfaces of the unpoled polymeric film layer and poled piezo film layer. A quarter wave reflector is disposed between inner surfaces of the two layers. An ultrasonic contact transducer array comprises a common poled piezo film layer and a common backing/insulating layer. A plurality of quarter wave reflector elements are disposed between inner surfaces of the poled piezo film layer and backing/insulating layer. Shielding electrodes are disposed on the outer surfaces of the two layers. A polymeric shielding layer is preferably disposed around the quarter wave reflectors. Lead means provide an electrical path from the quarter wave reflectors to a common edge of the array.

72 Claims, 6 Drawing Sheets

FIG. 1
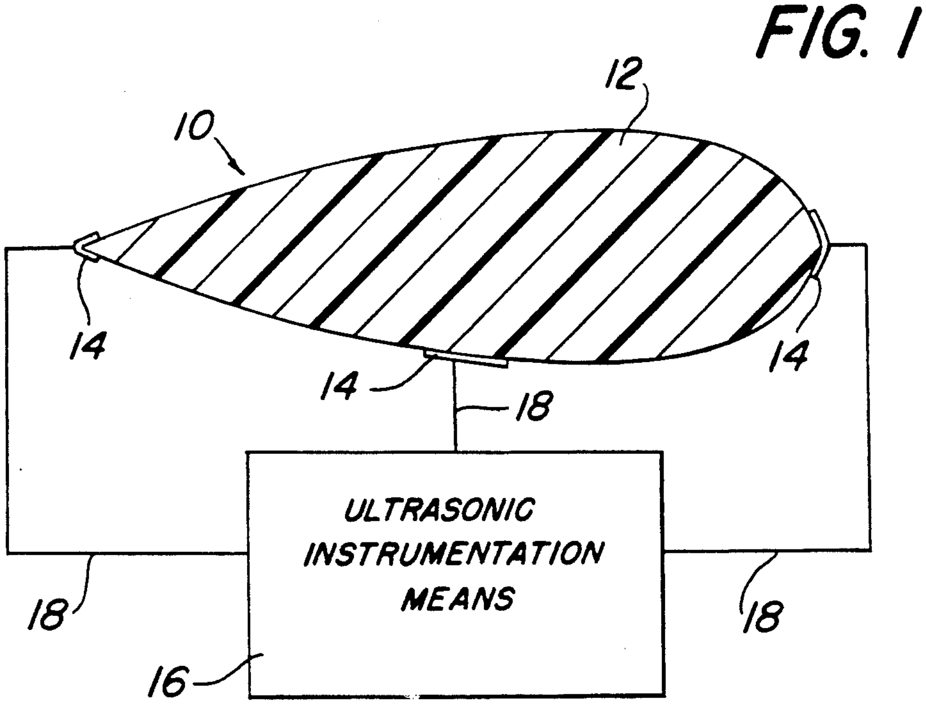
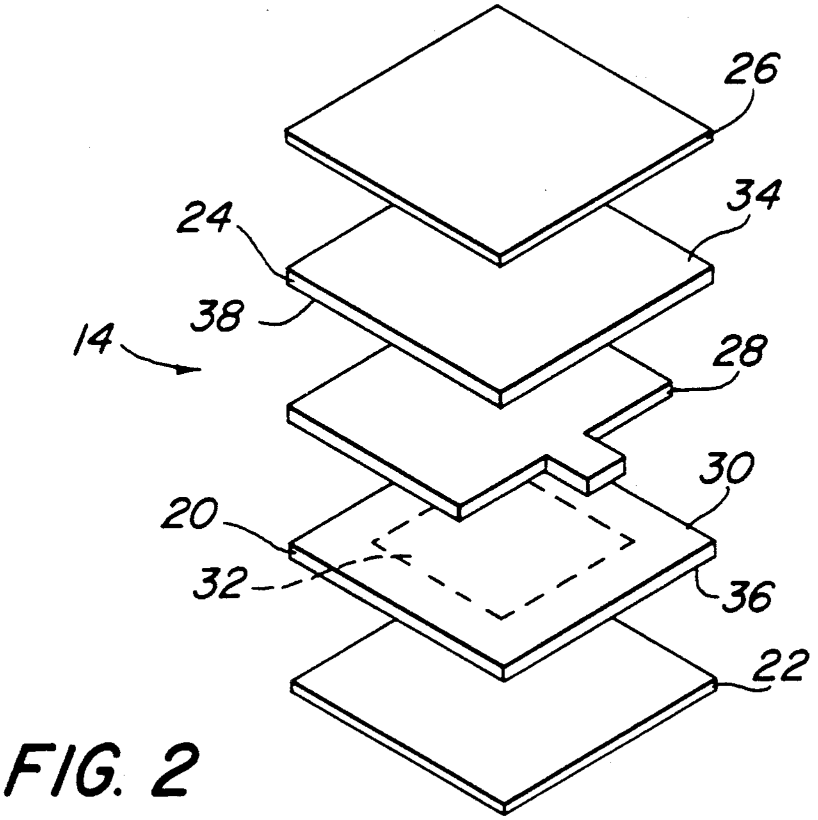
FIG. 2

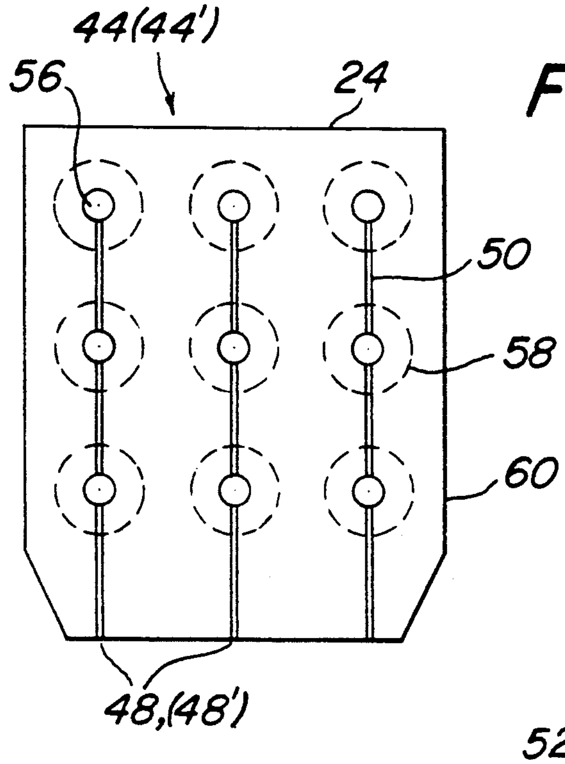
FIG. 9
FIG. 11
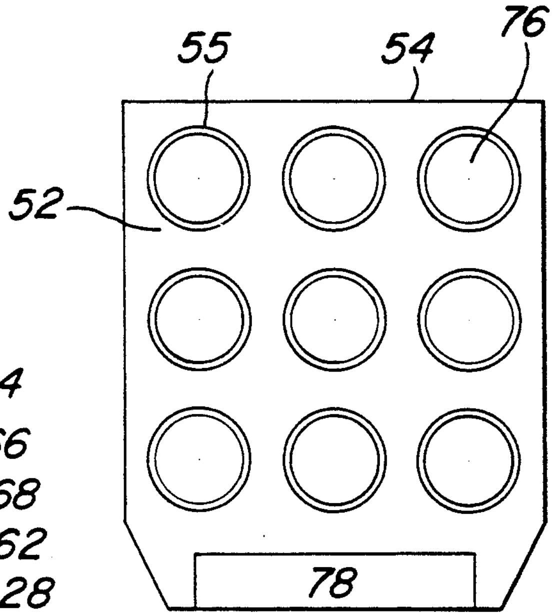
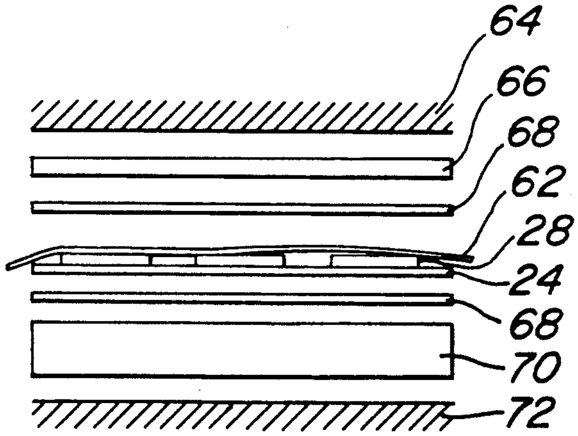
FIG. 10
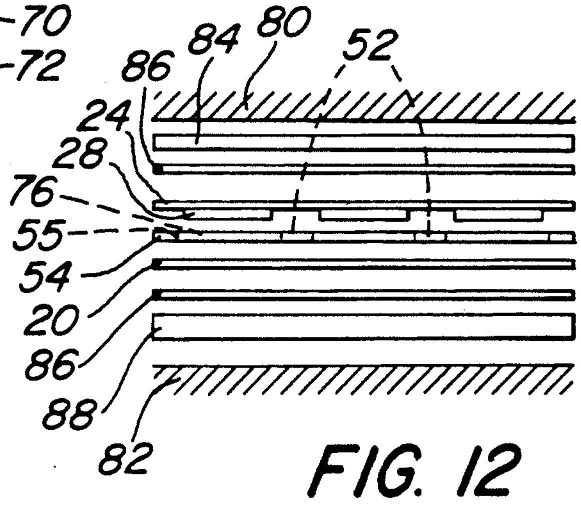
FIG. 12

FIG. 13A
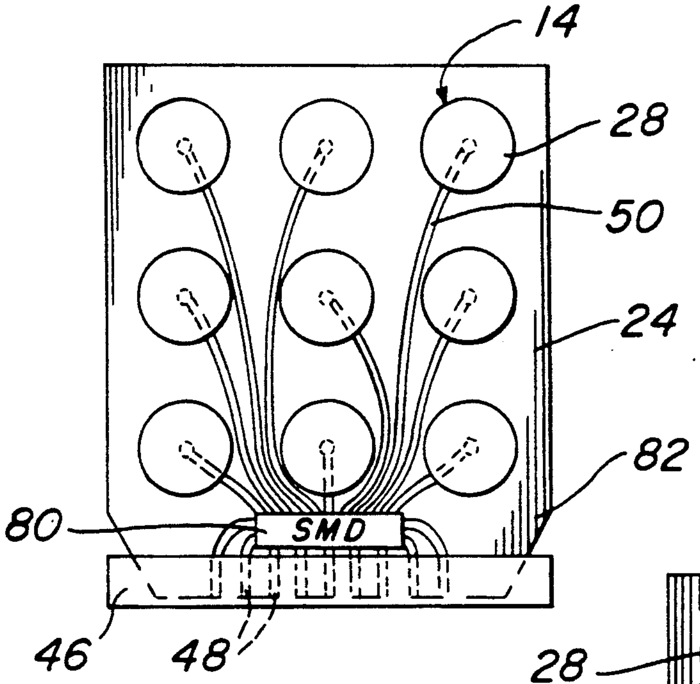
FIG. 13B
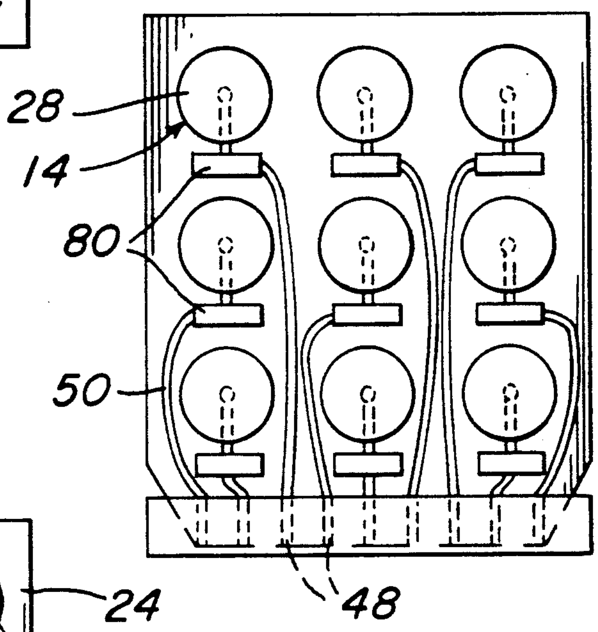
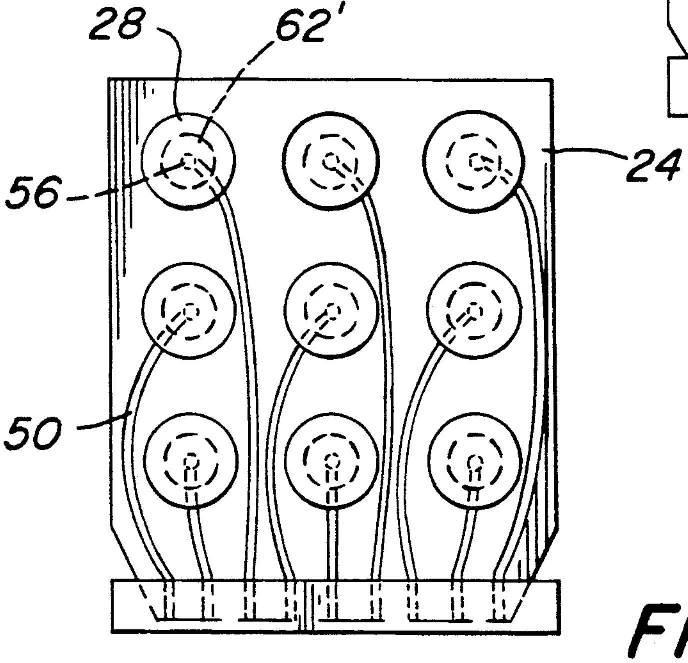
FIG. 14

FIG. 15A
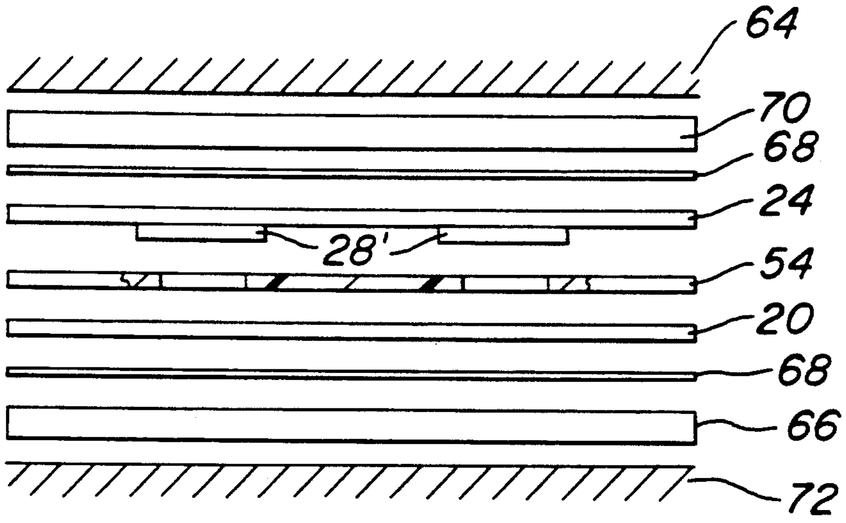
FIG. 15B
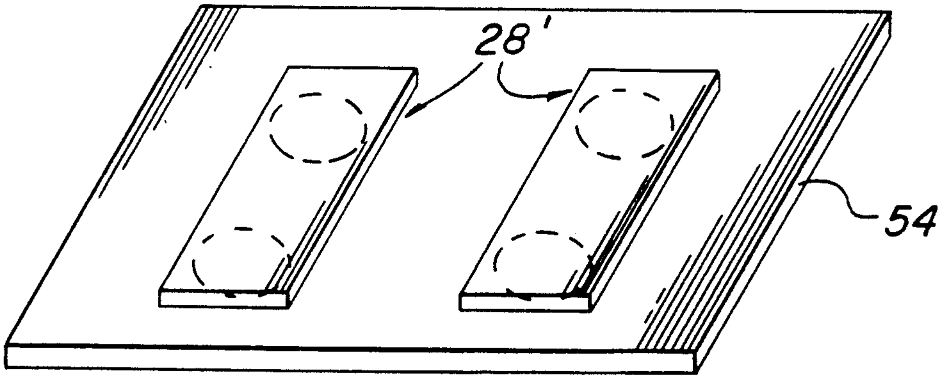
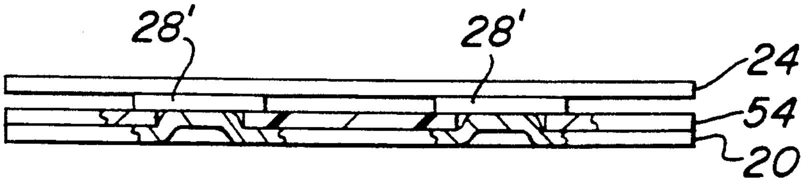
FIG. 15C

ULTRASONIC CONTACT TRANSDUCER AND ARRAY

RELATED APPLICATION DATA

This is a continuation-in-part of commonly assigned application Ser. No. 411,918 filed Sept. 26, 1989 entitled "Ultrasound Contact Transducer and Array," now abandoned.

FIELD OF THE INVENTION

This invention relates generally to nondestructive testing, and more particularly to piezo film ultrasonic contact transducers and transducer arrays for use in nondestructive testing.

BACKGROUND OF THE INVENTION

The technology of "nondestructive testing" allows structural examination of devices and materials without destruction or disassembly of the device or material under test. Nondestructive testing is commonly employed to detect unsafe or potentially unsafe conditions, such as cracks, voids, holes and structural flaws in metals, plastics, and composite materials and devices made therefrom. Nondestructive testing has found application to both on-line inspection at point of material manufacture and on-site testing of installed products. Instrument mobility is a particularly important consideration to on-site nondestructive testing.

One method of nondestructive testing utilizes ultrasonic instrumentation which electrically stimulates a contact transducer. The electrical stimulus excites the contact transducer which responds by oscillating at an ultrasonic frequency. When the contact transducer is acoustically coupled to a material or device to be tested, the contact transducer excites that material or device as well, so that ultrasonic vibrations travel through the material or device. Reflections, or echoes, of the incident vibrations from defects are processed by instrumentation which indicates locations and/or sizes of the defects on a visual display, such as a cathode ray tube.

It is known in the prior art to employ a piezo ceramic material for the contact transducer. Examples of such prior art contact transducers are the "Accuscan" and "Videoscan" transducers manufactured by Panametrics of Waltham, Massachusetts. A problem with piezo ceramic contact transducers, however, is that they are typically thick, bulky and inflexible, and do not acoustically match well with most composite materials. Since these transducers are inflexible, they are not suitable for use on surfaces that are curved or complex in shape. Additionally, since they are bulky, these transducers are not well suited for mobile use.

It is also known in the prior art to employ a piezo film material for the contact transducer. One example of a prior art nondestructive testing apparatus which utilizes piezo film contact transducers is the Portable Automated Remote Inspection System (PARIS) manufactured by Failure Analysis Associations, Inc. of Redmond, Wash., a subsidiary of Sigma Technologies Corporation. PARIS employs large area flexible transducer arrays which comprise, for example, 1024 addressable transducer elements that are configured in a 32×32 array in a "blanket" configuration. While piezo film contact transducers are generally more adaptable than their piezo ceramic counterparts, the blanket of the PARIS system is bulky, heavy and must be vacuum sealed. Further, it is not readily deformable, it must be addressed by a computer, it cannot be permanently adhered to the surface of the material under test, it will not fit into tight places, and it is not disposable or expendable.

Piezo film contact transducers are also manufactured by the assignee of the present invention, Pennwalt Corporation, under the trademark Kynar®. The DT, LDT, BDT, SDT and FDT family of KYNAR® transducers are exemplary. Model number LDTI-028K is typical of Pennwalt's Kynar® piezo film contact transducers. It is constructed from a 28 μm-thick layer of poled polyvinylidene fluoride (PVDF) that is laminated to a 5-mil layer of Mylar® (a registered trademark of DuPont), and protected by a screenprinted clear polymer coating made of fluoropolymers, urethanes or acrylics, or by an acrylic-adhesive backed polyester tape such as 3M #850 tape. More detailed information relating to particular piezo film contact transducers of this type is found in the "Kynar® Piezo Film Product Summary and Price List" (1988) available from Pennwalt Corporation of Philadelphia, Pa. Additional information relating to the structure, properties, application and fabrication of Kynar® piezo film contact transducers is found in the "Kynar® Piezo Film Technical Manual" (1987), also available from Pennwalt Corporation. Both of these publications are incorporated herein by reference.

Notwithstanding the great extent to which Kynar® piezo film contact transducers have been successfully used, these transducers suffer from several disadvantages in their application as ultrasonic contact transducers. For example, they are not electrically shielded and are susceptible to electromagnetic interference, which is a problem in the environment of use in industries such as the aerospace industry. Furthermore, coatings and laminations which are typically used in the manufacture of piezo film contact transducers, such as Kynar®, impede ultrasonic performance, thus making them generally unsuitable for ultrasonic contact transducer applications.

It is therefore desirable to provide an ultrasonic piezo film contact transducer that is flexible, is acoustically well matched to composite materials and is not susceptible to electromagnetic interference, but is inexpensive, lightweight, portable and easy to manufacture. It is also desirable to provide a structure for an ultrasonic film contact transducer that can easily and economically be employed to manufacture one piece arrays of transducers that have good acoustic and electric properties. The present invention achieves these goals.

SUMMARY OF THE INVENTION

An ultrasonic contact transducer according to the invention comprises: an unpoled polymeric film layer, defining a backing/insulating layer, having outer and inner surfaces; a first electrode shielding layer disposed on the outer surface of the unpoled polymeric film layer; a poled piezo film layer having outer and inner surfaces; a second electrode shielding layer disposed on the outer surface of the poled piezo film layer; and, a quarter wave reflector disposed between the inner surfaces of the unpoled polymeric film layer and the poled piezo film layer. A metallic charge collection layer may be disposed between the inner surface of the poled piezo film layer and the quarter wave reflector.

The unpoled polymeric film layer may comprise unpoled piezo film, such as unpoled polyvinylidene fluoride, or a polyethylene teraphthalate, such as MYLAR® The thickness of the unpoled polymeric film layer is preferably no greater than about ¼ wavelength. The poled piezo film layer may comprise a layer of polyvinylidene fluoride; a copolymer of vinylidene fluoride, such as a copolymer of vinylidene fluoride and at least one of trifluoroethylene, tetrafluoroethylene, hexafluoroethylene and vinylidene chloride; a polymer of polyvinyl chloride; or, a polymer of acrylonitrile. Preferably, the thickness of the poled piezo film layer and the quarter wave reflector layers is about ¼ wavelength.

An ultrasonic contact transducer array according to the invention comprises: a common backing/insulating layer having inner and outer surfaces; a first shielding electrode disposed on the outer surface of the common backing/insulating layer; a common poled piezo film layer having inner and outer surfaces; a second shielding electrode disposed on the outer surface of the common poled piezo film layer; a plurality of quarter wave reflector elements disposed between the inner surfaces of the common backing/insulating layer and the common poled piezo film layer; a polymeric shielding layer disposed around the quarter wave reflector elements and having a metallic layer defining a ground plane on a surface adjacent the common poled piezo film layer but electrically isolating the quarter wave reflector elements from each other and from the ground plane; and, a plurality of lead means disposed between the inner surface of the common backing/insulating layer and the quarter wave reflector elements for providing an electrical path from the quarter wave reflector elements to a common edge of the array.

The construction of each transducer in the array may be the same as or similar to the construction of the individual transducers described above. The array may include one or more electronic components, such as amplifer circuitry embodied as surface mounted integrated circuits, mounted directly on the backing/insulating layer of the array.

BRIEF DESCRIPTION OF THE DRAWINGS

FIG. 1 depicts an exemplary application of flexible ultrasonic contact transducers in accordance with the present invention;

FIG. 2 is an exploded view of a single piezo film ultrasonic contact transducer according to the present invention;

FIG. 9 illustrates one layer of the transducer array of FIG. 6.

FIG. 10 illustrates one step of manufacturing a transducer array in accordance with one embodiment of the invention.

FIG. 11 illustrates another layer of the transducer array of FIG. 6.

FIG. 12 illustrates another step of manufacturing a transducer array in accordance with one embodiment of the invention.

FIGS. 13A and 13B illustrate a transducer array according to yet another embodiment of the invention.

FIG. 14 illustrates a transducer array according to still another embodiment of the invention.

FIGS. 15A–15C illustrate a method of manufacturing a transducer array according to yet another embodiment of the invention.

DETAILED DESCRIPTION OF THE INVENTION

Figure 3:
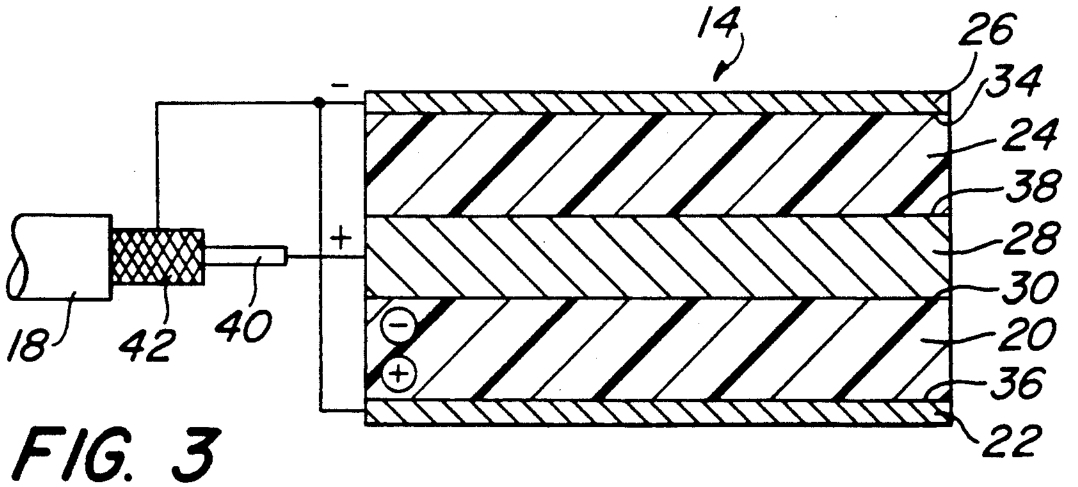
FIG. 3 illustrates, partly in section, one embodiment of the single transducer shown in FIG. 2 coupled to a coaxial cable.

Referring now to the drawings, wherein like characters designate like or corresponding parts throughout the several views, there is shown diagrammatically in FIG. 1 a nondestructive testing apparatus 10 for performing ultrasound tests on an object 12, such as an aircraft wing component manufactured from composite materials. The apparatus 10 generally comprises one or more flexible piezo film ultrasonic contact transducers 14, ultrasonic instrumentation means 16 for stimulating transducers 14 as well as for processing return signals received from the transducers 14, and cable means 18 for electrically coupling the contact transducers to the ultrasonic instrumentation means and carrying the stimulation and return signals. Each transducer may be a single ultrasonic contact transducer 14 constructed as described herein, or each may be a transducer array 44 or 44′ (FIGS. 6 and 7) constructed as described herein. Except as noted, the basic construction and structure of the individual transducers 14 and the transducer arrays 44, 44′ is similar, however each will be described separately for purposes of clarity. It is to be understood therefore, that a transducer array 44, 44′ may be constructed in accordance with the teachings of the single transducer embodiment 14, including, for example, an array of single transducers 14.

Single Transducer Embodiment

FIGS. 2–5 illustrate the structure of a single transducer 14 according to the present invention. Each of the transducers 14 comprises a "poled" piezo film layer 20, a first shielding electrode 22 disposed on the outer surface 36 of the piezo film layer 20, an unpoled polymeric film layer 24, a second shielding electrode 26 disposed on the outer surface 34 of the polymeric layer 24, and a metallic layer 28, forming a quarterwave reflector, that is laminated between the inner surfaces 30, 38 of the layers 20, 24, respectively. The poled piezo film layer is preferably oriented as shown, i.e., with the negative (−) side adjacent the quarter wave reflector layer 28 (i.e., disposed inwardly) and the positive (+) side adjacent the first shielding electrode layer 22 (i.e., disposed outwardly). The unpoled polymeric film layer 24 forms a backing/insulating layer, which, when constructed as herein described, provides improved acoustic attenuation and electrical shielding relative to prior art transducers. The first and second shielding electrodes also substantially reduce the susceptibility of the transducer 14 to electromagnetic interference (EMI) when constructed as herein described.

"Poling" is well known and refers to the process of exposing a piezo material to a high electric field at elevated temperatures. The level of piezo activity obtained from poling depends not only upon the poling time, but also upon the field strength and temperature. When carried out properly, the poling process provides a substantially permanent orientation of molecular dipoles within the piezo material. Thereafter, when a working voltage is applied to the electrodes of the poled piezo material, the poled piezo material will elongate or contract, depending upon the polarity of the applied voltage. Conversely, when an external force is applied to the poled piezo material (compressive or tensile strain), the poled piezo material will develop a proportionate open circuit voltage.

The poled piezo film layer 20 shown in FIGS. 2-5 preferably comprises a polymeric piezo material, such as polyvinylidene fluoride (PVDF); a copolymer of vinylidene fluoride (VDF), such as a copolymer of VDF with at least one of trifluoroethylene (TrFE), tetrafluoroethylene, hexafluoroethylene or vinylidene chloride; a polymer of polyvinyl chloride; or, a polymer of acrylonitrile. One suitable polyvinylidene fluoride film is manufactured under the registered trademark Kynar® by the assignee of the present invention, although other polymeric piezo films can be utilized without departure from the true scope of this invention. The other above mentioned films that can be employed in the practice of the invention are also commercially available.

The unpoled polymeric film layer 24 preferably comprises either an unpoled piezo film layer, such as unpoled PVDF, or a layer of polyethylene teraphthalate, such as MYLAR®. Better results have been observed when polyethylene teraphthalate, such as MYLAR®, is utilized for the backing/insulating layer 24. When the unpoled piezo film has been mechanically orientated during processing, it is preferable to anneal the layers 24 to prevent, or at least reduce, shrinkage which may occur when the transducer is used in high temperature applications.

Aluminum or copper foils may be employed for the quarter-wave reflector 28. The quarter wave reflector layer 28 and the poled piezo film layer 20 preferably have thicknesses t (which is different for the two layers) determined according to the following equation:

$$t = v_r/4f_o,$$

where $f_o$ is the resonant frequency of the poled piezo film layer 20, and $v_r$ is the acoustic velocity of the layer 20 or 28 for which the thickness is to be determined. The resonant frequency $f_o$ of the poled piezo film layer 20 can be easily determined according to the equation:

$$f_o = c_f/4d,$$

where d is the thickness of the poled piezo film layer 20, and $c_f$ is its acoustic velocity. For example, for a 12 MHz resonant frequency, the thickness of a poled PVDF film layer 20 ($v_r$=2400 m/sec) would be 50 μ and the thickness of a copper layer 28 ($v_r$=5000 m/sec) would be 104 μ. Stated otherwise, the thickness of the layers 20, 28 should not exceed, and preferably should be about equal to, ¼ of the wavelength of the piezo film layer's resonant frequency calculated at the acoustic velocity of the layer under consideration.

The purpose of the unpoled backing/insulating layer 24 is two-fold: (i) to prevent, or at least minimize, reflection of any acoustic energy that may pass through the quarter wave reflector layer 28 back into the layers 20, 28; and (ii) to electrically insulate the quarter wave reflector layer 28 from the outside environment and reduce EMI and other electrical noise. Thus, from an acoustic viewpoint, the backing/insulating layer 24 should have a thickness that substantially reduces acoustic reverberation therein. From an electrical standpoint, the backing/insulating layer 24 is a dielectric material representing a shunt capacitance and this capacitance should be minimized. An important consideration is that the dissipation factor, or loss tangent (tan $\delta_e$), of the backing/insulating layer 24 be less than or equal to that of the poled piezo film layer 20. Preferably, the dissipation factor of the backing/insulation layer 24 is less than that of the poled piezo film layer 20. When unpoled piezo film, such as unpoled PVDF, is employed as the backing/insulating layer, good results have been observed when its thickness is about ¼ of the wavelength of the poled piezo film's resonant frequency calculated at the backing/insulating layer's acoustic velocity. When polyethylene teraphthalate, such as MYLAR®, is employed as the backing/insulating layer 24, excellent results have been observed when the thickness is from ⅛ to 1/16 of the wavelength of the resonant frequency of the poled piezo film layer calculated at the backing/insulating layer's acoustic frequency. However, good results have been observed even when this material is as thick as ¼ wavelength. Generally, therefore, it can be said that the thickness of the unpoled backing/insulating layer should be no greater than about ¼ of the wavelength of the resonant frequency of the poled piezo film layer calculated at the backing/insulating layer's acoustic velocity, or:

$$t \leqq v_r f_o$$

where t is the thickness of the unpoled backing/insulating layer, $v_r$ is the acoustic velocity of the unpoled backing/insulating layer, and $f_o$ is the resonant frequency of the poled piezo film layer. Overall, use of polyethylene teraphthalate, such as MYLAR®, is preferred for the backing/insulating layer 24.

Figure 4:
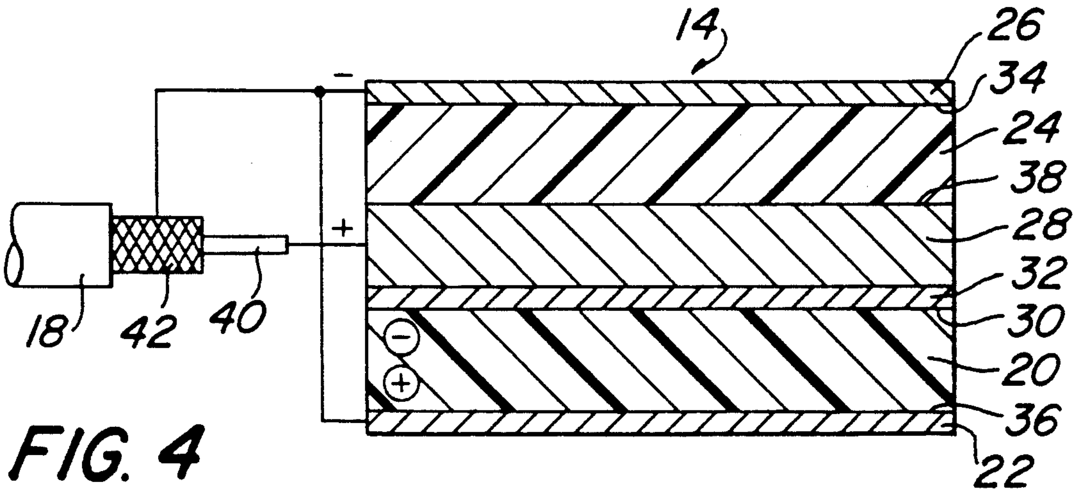
FIG. 4 depicts, partly in section, another embodiment of the single transducer shown in FIG. 2 coupled to a coaxial cable.

Referring now to FIGS. 2 and 4, it can be seen that the poled piezo film layer 20 preferably includes (on the inner surface 30 thereof) a metallic layer or coating 32. This coating is preferably provided on the negative side of the poled piezo film layer 20 and has been found to provide better collection of charge. This coating, however, is not necessary to practice this invention. The coating may be applied by any well known procedure such as vacuum deposition or silk screening. Vacuum deposition is preferred over silkscreened conductive inks because thinner layers can be deposited (100–1,000 Angstroms versus 1–10 microns). Conductive layers thicker than 1,000 Angstroms may adversely affect acoustic performance by causing unwanted reflections and acoustic impedance mismatching between the poled piezo film and quarter-wave reflector layers. Thus, a vacuum deposited layer from 100 to 1,000 Angstroms thick is preferred.

Copper, silver, nickel, aluminum, tin, chromium or gold, or combinations of those metals are preferably employed for the first and second shielding electrodes 22, 26 and may be vacuum-deposited or silk screened. Vacuum-deposited layers preferably should not exceed more than about 1000 Angstroms, while silk-screened conductive inks should preferably be applied in thicknesses of from about 3 microns to about 5 microns.

Figure 5:
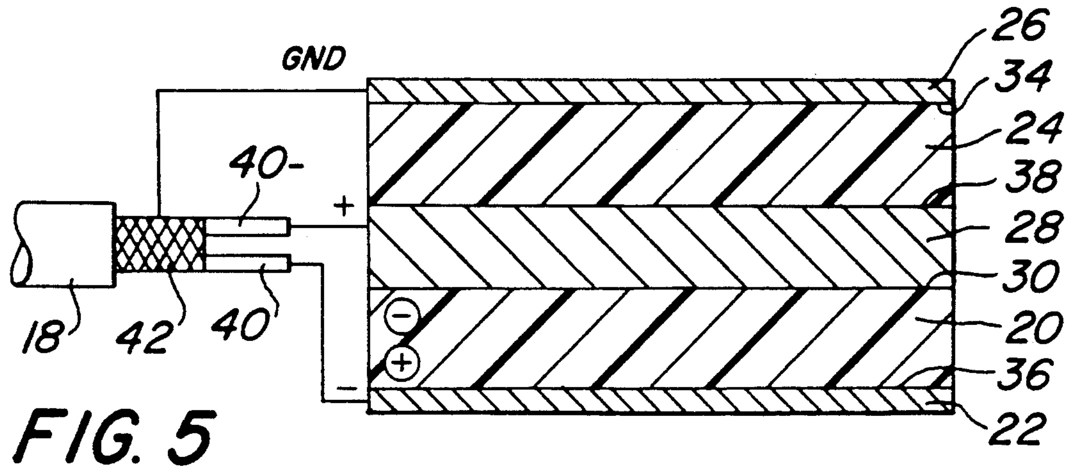
FIG. 5 illustrates, partly in section, the embodiment of the single transducer shown in FIG. 2 coupled to a shielded cable having a pair of conductors.

Various techniques may be employed to couple each transducer 14 to the ultrasonic instrumentation means 16 (FIG. 1), as shown in FIGS. 3-5. Each technique employs a cable 18 to perform the coupling, but the cabling and wiring of the cabling to the transducer, may take different forms.

Referring to the embodiment of FIG. 3, for example, the cable 18 is a well known coaxial cable that includes at least one conductor 40 and a shield 42. As shown, shield 42 of the coaxial cable 18 is coupled to both the first and second electrodes 22, 26, and the center conductor 40 is connected to the quarter-wave reflector 28. In this embodiment, the first and second electrodes 22, 26 are shorted together as shown. A conductive silver ink may be employed to effect the shorting of the two electrodes.

FIG. 4 illustrates a preferred coupling for an alternative embodiment of the transducer 14, i.e., having the metallic layer 32 as hereinabove described. The coupling is identical to that of FIG. 3.

FIG. 5 illustrates yet another preferred coupling for a transducer 14 of the type described herein. The coupling of FIG. 5 employs a so called twin-axial or "twinax" cable 18 having a pair of center conductors. In this embodiment, first electrode 26 is coupled to the shield 42 which provides a ground ("GND"). The quarter-wave reflector 28 is coupled to one of the center conductors 40. The second electrode 22 is coupled to the other center conductor 44. In this embodiment, the first and second electrodes 22, 26 are not shorted together.

Transducer Array Embodiment

Figure 6:
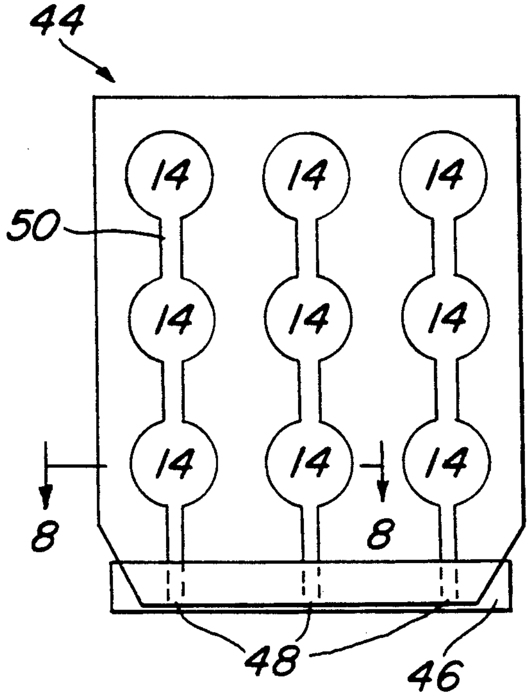
FIG. 6 illustrates a transducer array according to one embodiment of the invention.
Figure 7:
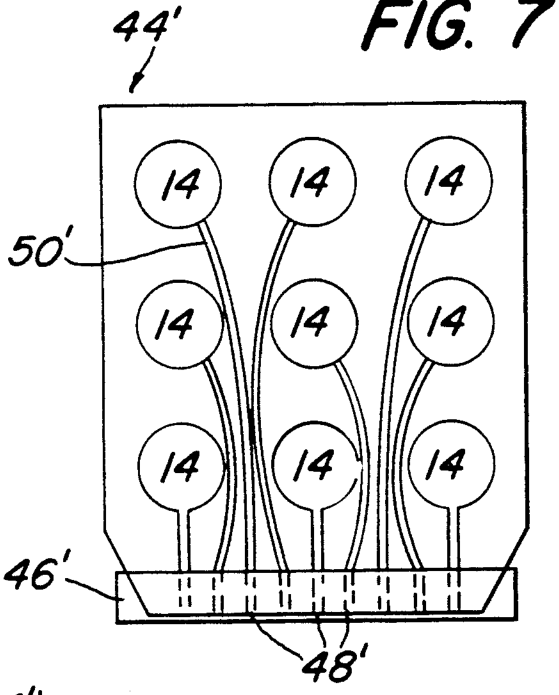
FIG. 7 illustrates a transducer array according to another embodiment of the invention.
Figure 8:
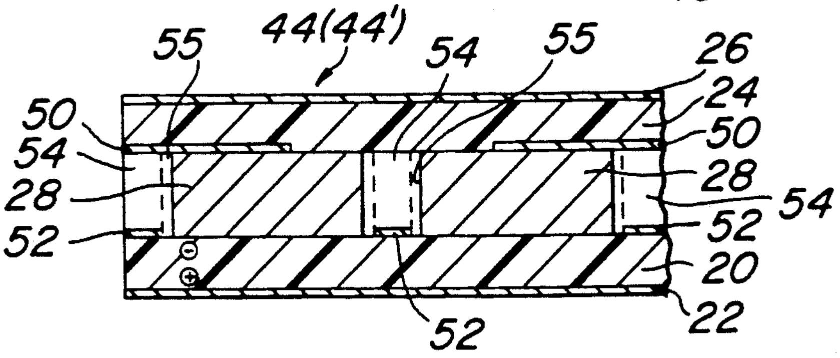
FIG. 8 is a cross section taken through line 8—8 of FIG. 6.

FIGS. 6-9 and 11 illustrate the structure of two embodiments of a transducer array according to the present invention, i.e., FIG. 6 illustrates one embodiment, while FIG. 7 illustrates another embodiment, but FIGS. 8, 9 and 11 are applicable to both embodiments. FIGS. 10 and 12 illustrate a method of constructing the transducer arrays according to one aspect of the invention.

As shown, a plurality of like transducers 14 are arranged in an integral one piece array 44 (FIG. 6) or 44' (FIG. 7). In the embodiment of FIG. 6, the transducers 44 are arranged into a plurality of electrically coupled groups, consisting of electrically coupled rows (or columns), each group being individually addressable by means of pin outs or pads 48. In the embodiment of FIG. 7, each transducer 14 of the array 44' has a separate electrical lead to a separate associated pin out or pad 48' so that each transducer is individually addressable. In both cases, the pin outs or pads 48, 48' are adapted to mate with an electrical edge connector 46, 46'. Except for the transducers of the array 44 being arranged into electrically coupled groups (whereas those of array 44' are not electrically coupled), the structure of the arrays is identical. That structure will now be described.

Referring to FIG. 8, each array 44, 44' shares a common backing/insulating layer 24, a common poled piezo film layer 20, a common first electrode shielding layer 22 and a common second electrode shielding layer 26. However, each transducer 14 has a separate quarter wave reflector element 28, as shown. The preferred materials of construction, their thicknesses, the considerations to be given to their manufacture, etc., are as hereinbefore described in connection with the single transducer embodiment.

Referring still to FIG. 8, the array 44, 44' further comprises a common lead shielding layer 54 and a pair of hot leads 50, 52 which will be described in more detail hereinafter. The hot leads 50 correspond to the leads shown in FIGS. 6 and 7 that connect each of the transducers 14 to the pin outs or pads 48, 48'. It will be appreciated from FIG. 8 that the first shielding electrode 22 is disposed on the outer surface of the common poled piezo film layer 20 and that the second shielding electrode 26 is disposed on the outer surface of the common backing/insulating layer 24. It will also be appreciated that each of the quarter wave reflector elements 28 is disposed between the inner surfaces of the common backing/insulating layer 24 and the common poled piezo film layer 20. It will further be appreciated that the lead shielding layer 54, which is disposed around each of the quarter wave reflector elements 28, is also disposed between the inner surfaces of the common backing/insulating layer 24 and the common poled piezo film layer 20. Further, it will be appreciated that each of the hot leads 50 is disposed between the inner surface of the common backing/insulating layer 24 and the quarter wave reflector elements 28.

As mentioned, the hot leads 50 provide an electrical path from each of the quarter wave reflector elements 28 to a common edge of the array 44, 44', such as to pin outs or pads 48, 48'. Preferably, a common hot lead 52, defining a ground plane, is disposed on a surface of the lead shielding layer 54 that is adjacent to the inner surface of the common poled piezo film layer 20, as shown. As also shown, the lead shielding layer 54 preferably has a clearance area 55 around each of the quarter wave reflector elements 28 so as to electrically isolate the quarter wave reflector elements 28 from each other and from the ground plane 52.

Turning now to FIG. 9, further details of the construction of the array 44, 44' will be described. The quarter wave reflector elements 28 may be disc shaped, in which case alignment borders 58 may be provided (e.g., printed or etched) on the inner surface of the common backing/insulating layer 24 to aid in the placement of each of the elements 28 as will become evident hereinafter. Before affixing the quarter wave reflector elements 28 to this layer, however, lead contacts 56 and electrical leads 50 must first be provided on the inner surface of the common backing/insulating layer 24. Preferably, the electrical leads 50 and lead contacts 56 comprise conductive silver ink applied by any well known means such as silk screening, or a metallized contact pattern affixed to the surface. Thereafter, and as better illustrated in FIG. 10, each quarter wave reflector element 28 is applied within the alignment borders 58, e.g., by conductive epoxy. PVC tape 62 is thereafter applied across each row of elements 28 and pressed together until the epoxy has cured. However, before bonding the quarter wave reflector elements 28 to the layer 24, the inner surface thereof should first be vapor-degreased and helium plasma etched.

FIG. 10 illustrates a preferred method for pressing the elements 28 to the layer 24. As shown, the layer 24 containing the epoxy, quarter wave reflector elements 28 and PVC tape 62 is pressed between two platens 64, 72. A neoprene cushion 66 and a 5-10 mil polyethylene release layer 68 are preferably disposed between the platen 64 and the quarter wave elements 28 and PVC tape 62, as shown. Another 5-10 mil polyethylene release layer and a sheet of ½ inch plate glass 70 are preferably disposed between the platen 72 and the layer 24, as shown. The platen 72 is preferably heated to about 65° C. Moderate pressure, i.e., about 100 psi, is applied to the platens so as to press each of the quarter wave reflector elements 28 onto the layer 24 for a secure bonding. The press is preferably heated to 40°-70° C. for several hours until the conductive epoxy has cured. The neoprene cushion 66 aids in applying uniform pressure to each of the quarter wave reflector elements 28 and in preventing them from moving out of position during curing.

After the conductive epoxy has cured and the assembly 24, 28 is removed from the press, the PVC tape 62 should be removed and the assembly 24, 28 should again be vapor-degreased and helium plasma etched.

The lead shielding layer 54 may be applied after completion of the preceding steps. FIG. 11 illustrates one preferred construction of a lead shielding layer 54. As shown, the lead shielding layer 54 is a film having a plurality of disc-shaped cutouts 76 at locations corresponding to locations of the quarter wave reflector elements 28 on the common backing/insulating layer 24. One side of the lead shielding layer 54 is coated with conductive silver ink, or metallization, by any well known means, to provide the ground plane 52. No ground plane or electroding is provided in the region 78 where the pin outs or pads 48, 48' are to be provided. As mentioned, clearance areas 55 are provided around the periphery of each of the quarter wave reflector elements 28 to prevent electrical shorting therebetween. Alternatively, the lead shielding layer 54 may abut the quarter wave reflector elements 28, but no metallization or electroding is provided in the regions 55 adjacent the periphery of the elements 28. The lead shielding layer is preferably about 0.001 inch thinner than the thickness of the quarter wave reflector elements 28.

FIG. 12 illustrates one method of performing the final construction step. Preliminary to performing this step, each of the layers 20, 24 (including the epoxied quarter wave reflector elements 28) and 54 should be vapor degreased and helium plasma etched. RBC epoxy is thereafter preferably applied between each of the layers 20, 24 and 54 and these layers are pressed between a platen 80 and a platen 82 at about 200-500 psi until the epoxy has cured. A sufficient amount of epoxy should be applied so that it flows outwardly from the edges of each of the layers and the pressures should be sufficient to remove any air pockets in the epoxy. As shown, the press preferably includes a neoprene cushion 84 and a 5-10 mil polyethylene release layer 86 disposed between the platen 80 and the layer 24, and a 5-10 mil polyethylene release layer 86 and a sheet of ½ inch plate glass 88 disposed between the layer 20 and the platen 82. The platen 82 is preferably raised to a temperature of about 65° C. A preferred mixture for the epoxy is two parts 3215 to one part AB-530.

The following considerations should be taken into account when applying the epoxy between the layers 20, 24 and 54. The thickness of the epoxy layer, particularly between the common poled piezo film layer 20 and the quarter wave metallic reflector elements 28, should be thin enough so as not to impede acoustic performance. A thickness of 1-8 microns, and preferably 1-4 microns, has been shown to be acceptable for poled piezo film layers as thin as 28 microns.

If desired, a metallic charge collection layer 32 may be applied to the inner surface (negative side) of the common poled piezo film layer 20 as hereinbefore described. As a final step, after the epoxy has cured and the array has been removed from the press, the ground plane 52 may be electrically coupled to ground to provide electrical shielding. This prevents the common poled piezo film layer 20 from being piezo active in the regions between the quarter wave reflector elements 28. That is, without this ground plane 52, the poled piezo film layer 20 would be piezo active in the regions between the outer shielding layer 22 and the hot leads 50 and 50'. This would otherwise affect both the electrical and acoustic performance of the transducer.

As an alternative to use of the PVC tape 62 in the construction of the transducer arrays described herein, a plurality of washer shaped transfer elements 62', which may be die-cut from double faced tape, may be employed. See FIG. 14. In such case, each transfer element 62' should be placed on the backing/insulating layer 24 and centered about a respective one of the lead contacts 56. A drop of conductive epoxy is then applied over each lead contact 56 and the respective quarter wave reflector 28 is mounted thereon. The conductive epoxy maintains electrical contact between each lead contact 56, and hence the lead 50, and the respective quarter wave reflector 28. The transfer elements 62' perform the function of adhering the quarter wave reflectors 28 to the backing/insulating layer 24 so that electrical contact is made with lead contacts 56. One suitable material from which the die-cut washers defining the transfer elements 62' may be manufactured is 0.001 inch acrylic transfer adhesive film. Use of the transfer elements 62' in lieu of the PVC tape 62 omits the cumbersome task of maintaining alignment of the miscellaneous parts of the transducer array when fabricated as above described.

FIGS. 15A-15C illustrate another alternative to the manufacturing process illustrated in FIGS. 10, 11 and 12. It has been found that each of the quarter wave reflectors 28 do not need to be custom cut and individually bonded into place within the cutouts 76 of the lead shielding layer 54, as above described. Instead, as shown in FIGS. 15A and 15B, oversized metallic elements 28' may be disposed, without critical alignment, over a plurality of the cutouts 76 in the lead shielding layer 54. During the above described pressing operation (FIG. 15A), the poled piezo film layer 20 is pushed through each of the cutouts 76 and is capactively coupled through the epoxy (not shown) between layers 20, 24 and 54 with the oversized metallic elements 28', as shown in FIG. 15C. Although not shown in FIG. 15C, the relative position of the cushion 66 and plate glass 70 may be reversed so the oversized metallic elements 28' are pushed through the cutouts 76 and are capacitively coupled with the poled piezo film layer 20. The cutouts 76 may be formed by die-cutting the lead shielding layer 54 to the desired dimensions of the quarter wave reflector elements 28.

FIGS. 13A and 13B illustrate another modification to the transducer array embodiment of the invention. One of the problems with large area sensor arrays, or arrays with several elements, is that the generated signals may rapidly attenuate during transmission from the array to the instrumentation due to cabling losses. Ambient electrical noise may also pose problems, since the magnitude of the signals may be small relative to the noise. The embodiment of FIGS. 13A and 13B overcomes this problem by including interface electronics 80 directly on the sensor array for processing the generated signals. The interface electronics may include, for example, buffers, preamps, multiplexers, analog switches, charge amplifiers, transimpedance amplifiers or even one or more microprocessors. As shown in FIG. 13A, the interface electronics may comprise a single device, such as a surface mounted device (SMD), mounted close to the edge 82 of the array that receives and processes all of the signals from each sensor 14 and provides the processed signals to the pin-outs or pads 48. An advantage of mounting the device(s) close to the edge 82 is that it (they) will be free from the press platens 64, 72 during assembly. Alternatively, there may be a device 80 associated with, and mounted in generally close proximity to, each sensor 14, as shown in FIG. 13B, wherein each device 80 receives the signals from its associated sensor 14 and provides processed signals to the pin-outs or pads 48. In either case, the device(s) 80 may be mounted directly on the backing/insulating layer 24. More particularly, the device(s) 80 may be mounted on the side of the backing/insulating layer 24 containing the metallized pattern defining the leads 50 so that electrical connections between the device(s) and leads may be easily made. If desired, lead traces for the device(s) 80 may be patterned directly on the layer 24 to provide mounting locations for the devices(s) 80, and/or the device(s) 80 can be epoxy bonded to the the site of the mounting location.

It has been found that a single element transducer, as above described, or a one dimensional (i.e., one row or one column) array can be made without the element lead shielding layer 54. For one dimensional arrays of quarter wave reflector elements 28 which are located adjacent to the pin outs or pads 48, 48', the lead shielding layer 54 is not required. Irrespective of the dimension of the array (i.e., one or two dimensions), the layers 24 and 54, and the patterns thereon, can be silk-screened and die cut.

The array of the embodiment of FIG. 6 is useful for simple through-transmission measurements where two such arrays could be placed on either side of a structure, with the patterns rotated 90° with respect to each other. In the 3×3 array embodiment of FIG. 6, nine sites would be addressable with only three signal lines (plus ground) to each array.

The embodiment of FIG. 7 is useful where more quantitative measurements are needed and the cross talk of the embodiment of FIG. 6 cannot be tolerated.

Summation

Any commercially available ultrasonic instrumentation means 18 (FIG. 1), may be employed with the transducers 14 and transducers arrays 44, 44' described above. The transducers 14 and arrays 44, 44' are especially suitable for use with conventional pulse-echo and through-transmission instruments.

The transducer and array of the present invention are flexible and can thus conform to nonplanar surfaces commonly encountered in nondestructive testing. The transducer or array can be adhered directly, for permanent or temporary use, to surfaces and permits ultrasonic scanning without the use of a liquid acoustic coupling medium. By virtue of the cladding provided by the electrodes 22, 26, full electrical shielding is provided for use in high electromagnetic interference radiation environments. Moreover, the flexible contact transducer/array can be installed in areas which are difficult or impossible to access with conventional piezo ceramic contact transducers, and, since they are lightweight, they can be adhered to the underside of a structure and will remain in position. Still further, the flexible contact transducer/array can be custom cut or formed into complex shapes as needed, and they have acoustic impedance properties that are much closer to many aerospace composite materials than non-piezo film contact transducers. This results in more efficient acoustic coupling between the transducer/array and material under test, and thus a more broad-band response and better acoustic resolution. The flexible contact transducer/array is inexpensive enough so that several can be used at an economical cost, and so that they can be expended after use.

Obviously, many modifications and variations are possible in light of the above teachings. It is to be understood therefore, that within the scope of the appended claims the present invention may be practiced in other forms than as are specifically described herein.

What I claim as my invention is:

1. Ultrasonic contact transducer comprising:

a) an unpoled polymeric film layer having an outer surface and an inner surface, the unpoled polymeric film layer having a thickness that substantially reduces acoustic reverberation within said layer;

b) a first electrode shielding layer disposed on the outer surface of the unpoled polymeric film layer;

c) a poled piezo film layer having an outer surface and an inner surface;

d) a second electrode shielding layer disposed on the outer surface of the poled piezo film layer; and, e) a quarter-wave reflector disposed between the inner surfaces of the unpoled polymeric film layer and the poled piezo film layer.

2. Ultrasonic contact transducer according to claim 1 further comprising a metallic charge collection layer disposed between the inner surface of the poled piezo film layer and the quarter wave reflector.

3. Ultrasonic contact transducer according to claim 1 wherein the unpoled polymeric film layer is unpoled piezo film.

4. Ultrasonic contact transducer according to claim 3 wherein the unpoled piezo film layer is unpoled polyvinylidene fluoride.

5. Ultrasonic contact transducer according to claim 1 wherein the unpoled polymeric film layer is polyethylene teraphthalate.

6. Ultrasonic contact transducer according to claim wherein the poled piezo film layer and unpoled polymeric film layer are each characterized by a dielectric loss tangent and the dielectric loss tangent of the unpoled polymeric film layer is less than or equal to that of the piezo film layer.

7. Ultrasonic contact transducer according to claim 1 wherein the poled piezo film layer has a resonant frequency, and the unpoled polymeric film layer has an acoustic velocity and a thickness not exceeding about $\frac{1}{4}$ wavelength of the resonant frequency calculated at the unpoled polymeric film layer's acoustic velocity.

8. Ultrasonic contact transducer according to claim 7 wherein the thickness of the unpoled polymeric film layer is about $\frac{1}{8}$ wavelength of the resonant frequency calculated at the unpoled polymeric film layer's acoustic velocity.

9. Ultrasonic contact transducer according to claim 7 wherein the thickness of the unpoled polymeric film layer is about 1/16 wavelength of the resonant frequency calculated at the unpoled polymeric film layer's acoustic velocity.

10. Ultrasonic contact transducer according to claim 1 wherein the poled piezo film layer has a resonant frequency and the quarter wavelength reflector and poled piezo film layer each have thicknesses of about $\frac{1}{4}$ wavelength of the resonant frequency calculated at acoustic velocities of the poled piezo film layer and quarter wavelength reflector, respectively.

11. Ultrasonic contact transducer according to claim 1 wherein the poled piezo film layer comprises a layer of polyvinylidene fluoride film.

12. Ultrasonic contact transducer according to claim 1 wherein the poled piezo film layer comprises a copolymer of vinylidene fluoride.

13. Ultrasonic contact transducer according to claim 1 wherein the poled piezo film layer comprises one of: a copolymer comprising vinylidene fluoride and at least one of trifluoroethylene, tetrafluoroethylene, hexafluoroethylene and vinylidene chloride; a polymer of polyvinyl chloride; a polymer of acrylonitrile.

14. Ultrasonic contact transducer according to claim 3 wherein the unpoled piezo film layer is annealed to prevent substantial shrinkage at elevated temperatures.

15. Ultrasonic contact transducer according to claim 2 wherein the metallic charge collection layer has a thickness of no greater than about 1000 angstroms.

16. Ultrasonic contact transducer according to claim 15 wherein the metallic charge collection layer has a thickness between about 100 to 1000 angstroms.

17. Ultrasonic contact transducer according to claim 6 wherein the metallic charge collection layer is vacuum deposited onto the inner surface of the poled piezo film layer.

18. Ultrasonic contact transducer according to claim 1 wherein the first and second shielding electrodes are each a silk-screened conductive ink having a thickness of between about 3 to 5 microns.

19. Ultrasonic contact transducer according to claim 1 wherein the first and second electrode shielding layers are vacuum deposited layers of one of copper, silver, nickel, aluminum, tin chromium and gold having a thickness no greater than about 1000 angstroms.

20. Ultrasonic contact transducer according to claim 1 further comprising a cable for electrically coupling the contact transducer to an ultrasonic instrumentation means and carrying stimulation and return signals, the cable having at least one conductor and a shield, the conductor being electrically coupled to the quarter wave reflector and the shield being electrically coupled to at least one of the first and second electrode shielding layers.

21. Ultrasonic contact transducer according to claim 20 wherein the first and second electrode shielding layers are shorted together.

22. Ultrasonic contact transducer according to claim 20 wherein the electrical cable comprises a pair of conductors, a first conductor of the pair being electrically coupled to one of the first and second shielding electrodes, and the shield being electrically coupled to the other of the first and second shielding electrodes, the second conductor of the pair being electrically coupled to the quarter wave reflector.

23. Ultrasonic contact transducer according to claim 1 wherein the poled piezo film layer has a thickness determined by the equation:

$$d=c_f A f_o,$$

where d is the thickness of the poled piezo film layer, $c_f$ is an acoustic velocity of the poled piezo film layer, and $f_o$ is a resonant frequency of the poled piezo film layer.

24. Ultrasonic contact transducer according to claim 23 wherein the quarter wave reflector has a thickness determined by the equation:

$$t=v_r A f_o,$$

where t is the thickness of the quarter wave reflector and $v_r$ is an acoustic velocity of the quarter wave reflector.

25. Ultrasonic contact transducer according to claim 1 wherein the transducer is one of a plurality of like transducers arranged in an integral one piece array.

26. Ultrasonic contact transducer according to claim 25 wherein each of the transducers is individually addressable.

27. Ultrasonic contact transducer according to claim 25 wherein the transducers are arranged into a plurality of electrically coupled groups, the groups being individually addressable.

28. Ultrasonic contact transducer according to claim 25 wherein each transducer in the array shares a common backing/insulating layer, a common poled piezo film layer, and common first and second electrode shielding layers, but each transducer has a separate quarter wave reflector.

29. Ultrasonic contact transducer according to claim 25 wherein each transducer in the array shares a common backing/insulating layer, a common poled piezo film layer, and common first and second electrode shielding layers, and quarter wave elements of groups of transducers are formed from a common metallic element during assembly.

30. Ultrasonic transducer according to claim 25 further comprising at least one electronic component mounted on the array for processing signals generated by each transducer.

31. Ultrasonic contact transducer comprising:

a) a poled piezo film layer having inner and outer surfaces and a resonant frequency, the poled piezo film layer being selected from a group comprising polyvinylidene fluoride, a copolymer of vinylidene fluoride and at least one of trifluoroethylene, tetrafluoroethylene, hexafluoroethylene and vinylidene chloride, a polymer of polyvinyl chloride, and, a polymer of acrylonitrile, and having a thickness of about $\frac{1}{4}$ wavelength of the resonant frequency calculated at an acoustic velocity of the poled piezo film layer;

b) a first electrode shielding layer disposed on the outer surface of the poled piezo film layer;

c) a backing/insulating layer having inner and outer surfaces and being selected from a group comprising unpoled piezo film and polyethylene teraphthalate and having a thickness not exceeding about $\frac{1}{4}$ wavelength of the resonant frequency of the poled piezo film layer calculated at an acoustic velocity of the backing/insulating layer, the poled piezo film layer and backing/insulating layer both being characterized by a loss tangent, the loss tangent of the backing/insulating layer being less than or equal to that of the poled piezo film layer;

d) a second electrode shielding layer disposed on the outer surface of the backing/insulating layer; and, e) a metallic reflector disposed between the inner surfaces of the poled piezo film layer and the backing/insulating layer, the metallic reflector having a thickness of about $\frac{1}{4}$ wavelength of the resonant frequency of the poled piezo film layer calculated at an acoustic velocity of the metallic reflector and defining a quarter wave reflector.

32. Ultrasonic contact transducer according to claim 31 wherein the thickness of the backing/insulating layer is about $\frac{1}{8}$ wavelength of the resonant frequency calculated at the acoustic velocity of the backing/insulating layer.

33. Ultrasonic contact transducer according to claim 31 wherein the thickness of the backing/insulating layer is about 1/16 wavelength of the resonant frequency calculated at the acoustic velocity of the backing/insulating layer.

34. Ultrasonic contact transducer according to claim 31 wherein the backing/insulating layer is an annealed, unpoled piezo film layer.

35. Ultrasonic contact transducer according to claim 31 further comprising a metallic coating disposed on the inner surface of the poled piezo film layer and having a thickness of 100 to 1000 angstroms.

36. Ultrasonic contact transducer according to claim 31 wherein the transducer is one of a plurality of like transducers arranged in an integral one piece array.

37. Ultrasonic contact transducer according to claim 31 wherein each of the transducers is individually addressable.

38. Ultrasonic contact transducer according to claim 31 wherein the transducers are arranged into a plurality of electrically coupled groups, the groups being individually addressable.

39. Ultrasonic contact transducer according to claim 36 wherein each transducer in the array shares a common backing/insulating layer, a common poled piezo film layer, and common first and second electrode shielding layers, but each transducer has a separate quarter wave reflector.

40. Ultrasonic contact transducer according to claim 36 wherein each transducer in the array shares a common backing/insulating layer, a common poled piezo film layer, and common first and second electrode shielding layers, and quarter wave elements of groups of transducers are formed from a common metallic element during assembly.

41. Ultrasonic transducer according to claim 36 further comprising at least one electronic component mounted on the array for processing signals generated by each transducer.

42. Ultrasonic contact transducer array comprising:

a) a common backing/insulating layer having inner and outer surfaces;

b) a first shielding electrode disposed on the outer surface of the common backing/insulating layer;

c) a common poled piezo film layer having inner and outer surfaces;

d) a second shielding electrode disposed on the outer surface of the common poled piezo film layer;

e) a plurality of quarter wave reflectors disposed between the inner surfaces of the common backing-/insulating layer and common poled piezo film layer;

f) a polymeric shielding layer disposed adjacent the quarter wave reflectors and having a metallic layer defining a ground plane on a surface adjacent the common poled piezo film layer but electrically isolating the quarter wave reflectors from each other and from the ground plane; and, g) a plurality of lead means disposed between the inner surface of the common backing/insulating layer and the quarter wave reflectors for providing an electrical path from the quarter wave reflectors to a common edge of the array.

43. Ultrasonic contact transducer array according to claim 42 wherein the quarter wave reflectors are disk shaped, and the polymeric shielding layer is a polymeric film having disk shaped cutouts therein at locations corresponding to locations of the reflectors on the backing/insulating layer, there being no metallic layer at the area immediately adjacent the periphery of each disk shaped cutout.

44. Ultrasonic contact transducer array according to claim 43 wherein a die-cut transfer element is used to adhere the quarter wave element to the backing/insulating layer.

45. Ultrasonic contact transducer array according to claim 42 wherein each lead means provides a separate, individual electrical path from the common edge of the array to a different quarter wave reflector to define a plurality of individually addressable transducers in the array.

46. Ultrasonic contact transducer array according to claim 42 wherein each lead means interconnects a group of quarter wave reflectors and provides a separate electrical path from the common edge of the array to a different group to define a plurality of individually addressable groups.

47. Ultrasonic contact transducer array according to claim 42 wherein the lead means are coupled to pads disposed on the common edge of the array that are adapted to mate with an edge connector.

48. Ultrasonic contact transducer array according to claim 42 wherein the common backing/insulating layer is an unpoled polymeric film layer.

49. Ultrasonic contact transducer array according to claim 48 wherein the unpoled polymeric film layer is unpoled piezo film.

50. Ultrasonic contact transducer array according to claim 49 wherein the unpoled piezo film layer is unpoled polyvinylidene fluoride.

51. Ultrasonic contact transducer array according to claim 48 wherein the unpoled polymeric film layer is polyethylene teraphthalate.

52. Ultrasonic contact transducer array according to claim 48 wherein the unpoled polymeric film layer has a thickness that substantially prevents reflection of acoustic energy incident thereupon.

53. Ultrasonic contact transducer array according to claim 48 wherein the poled piezo film layer and unpoled polymeric film layer are each characterized by a dielectric loss tangent and the dielectric loss tangent of the unpoled polymeric film layer is less than or equal to that of the poled piezo film layer.

54. Ultrasonic contact transducer array according to claim 48 wherein the poled piezo film layer has a resonant frequency and the unpoled polymeric film layer has a thickness not exceeding about $\frac{1}{4}$ wavelength of the resonant frequency calculated at an acoustic velocity of the unpoled polymeric film layer.

55. Ultrasonic contact transducer array according to claim 54 wherein the thickness of the unpoled polymeric film layer is about $\frac{1}{8}$ wavelength of the resonant frequency calculated at the acoustic velocity of the unpoled polymeric film layer.

56. Ultrasonic contact transducer array according to claim 54 wherein the thickness of the unpoled polymeric film layer is about 1/16 wavelength of the resonant frequency calculated at the acoustic velocity of the unpoled polymeric film layer.

57. Ultrasonic contact transducer array according to claim 42 wherein the poled piezo film layer has a resonant frequency and the quarter wave reflectors and poled piezo film layer each have thicknesses of about ¼ wavelength of the resonant frequency calculated at acoustic velocities of the quarter wave reflectors and poled piezo film layer, respectively.

58. Ultrasonic contact transducer array according to claim 42 wherein the poled piezo film layer comprises a layer of polyvinylidene fluoride film.

59. Ultrasonic contact transducer array according to claim 42 wherein the poled piezo film layer comprises a copolymer of vinylidene fluoride.

60. Ultrasonic contact transducer array according to claim 42 wherein poled piezo film layer comprises one of: a copolymer comprising vinylidene fluoride and at least one of trifluoroethylene, tetrafluoroethylene, hexafluoroethylene and vinylidene chloride; a polymer of polyvinyl chloride; a polymer of acrylonitrile.

61. Ultrasonic contact transducer array according to claim 48 wherein the unpoled piezo film layer is annealed to prevent substantial shrinkage at elevated temperatures.

62. Ultrasonic contact transducer array according to claim 57 wherein the metallic layer defining the ground plane has a thickness of about 0.001 inch less than the thickness of the quarter wave reflectors.

63. Ultrasonic contact transducer array according to claim 42 wherein the lead means comprises silver ink silk screened onto the backing/insulating layer.

64. Ultrasonic contact transducer array according to claim 42 wherein the metallic layer defining the ground plane is silk screened silver ink.

65. Ultrasonic contact transducer array according to claim 42 wherein groups of quarter wave reflectors are formed from a common metallic element during assembly.

66. Ultrasonic transducer according to claim 42 further comprising at least one electronic component mounted on the array for processing signals generated by transducers in the array.

67. Ultrasonic transducer array according to claim 66 wherein the electronic component is a surface mount device mounted on the common backing/insulating layer in electrical communication with at least one of the lead means.

68. Ultrasonic contact transducer array comprising:

a) a common poled piezo film layer having inner and outer surfaces and a resonant frequency, the poled piezo film layer being selected from a group comprising polyvinylidene fluoride, a copolymer of vinylidene fluoride and at least one of trifluoroethylene, tetrafluoroethylene, hexafluoroethylene and vinylidene chloride, a polymer of polyvinyl chloride, and, a polymer of acrylonitrile, and having a thickness of about ¼ wavelength of the resonant frequency calculated at an acoustic velocity of the common poled piezo film layer;

b) a first electrode shielding layer disposed on the outer surface of the poled piezo film layer;

c) a common backing/insulating layer having inner and outer surfaces and being selected from a group comprising unpoled piezo film and polyethylene teraphthalate, and having a thickness not exceeding about ¼ wavelength of the resonant frequency of the poled piezo film layer calculated at an acoustic velocity of the common backing/insulating layer, the common poled piezo film layer and common backing/insulating layer both being characterized by a loss tangent, the loss tangent of the common backing/insulating layer being less than or equal to that of the common poled piezo film layer;

d) a second electrode shielding layer disposed on the outer surface of the backing/insulating layer;

e) a plurality of metallic reflector elements disposed between the inner surfaces of the common poled piezo film layer and the common backing/insulating layer, the metallic reflector elements each having a thickness of about ¼ wavelength of the resonant frequency of the poled piezo film layer calculated at an acoustic velocity of the metallic reflector elements and each defining a quarter wave reflector;

f) an unpoled polymeric shielding layer disposed adjacent the reflector elements and having a metallic layer defining a ground plane on a surface adjacent the common poled piezo film layer, but electrically isolating the reflector elements from each other and from the ground plane, the polymeric shielding layer having a thickness less than the thickness of the reflector elements; and, g) a plurality of lead means disposed between the inner surface of the backing/insulator layer and the reflector elements for providing an electrical path to pads disposed on a common edge of the array, the pads being adapted to mate with an edge connector.

69. Ultrasonic contact transducer array according to claim 68 wherein the polymeric shielding layer comprises an unpoled piezo film.

70. Ultrasonic contact transducer array according to claim 68 wherein groups of quarter wave reflectors are formed from a common metallic element during assembly.

71. Ultrasonic contact transducer array according to claim 68 further comprising at least one electronic component mounted on the array for processing signals generated by transducers in the array.

72. Ultrasonic contact transducer array according to claim 71 wherein the electronic component is a surface mount device mounted on the common backing/insulating layer in electrical communication with at least one of the lead means.

* * * * *